(12) United States Patent
Cao

(10) Patent No.: US 11,894,418 B2
(45) Date of Patent: Feb. 6, 2024

(54) SEMICONDUCTOR STRUCTURE, PREPARATION METHOD OF SAME, AND SEMICONDUCTOR DEVICE

(71) Applicant: CHANGXIN MEMORY TECHNOLOGIES, INC., Hefei (CN)

(72) Inventor: Xianlei Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 220 days.

(21) Appl. No.: 17/462,041

(22) Filed: Aug. 31, 2021

(65) Prior Publication Data

US 2022/0238639 A1 Jul. 28, 2022

Related U.S. Application Data

(63) Continuation of application No. PCT/CN2021/100192, filed on Jun. 15, 2021.

(30) Foreign Application Priority Data

Jan. 25, 2021 (CN) .......................... 202110098759.8

(51) Int. Cl.
*H10B 12/00* (2023.01)
*H01L 49/02* (2006.01)

(52) U.S. Cl.
CPC .............. *H01L 28/91* (2013.01); *H01L 28/87* (2013.01); *H10B 12/31* (2023.02)

(58) Field of Classification Search
CPC ... H01L 28/90–91; H01L 28/82; H01L 28/84; H01L 28/87; H10B 12/312; H10B 12/30–31
See application file for complete search history.

(56) References Cited

U.S. PATENT DOCUMENTS

| | | | |
|---|---|---|---|
| 4,906,590 A | 3/1990 | Kanetaki | |
| 5,354,705 A | 10/1994 | Mathews | |
| 5,438,011 A | 8/1995 | Blalock | |
| 5,556,802 A | 9/1996 | Bakeman, Jr. | |
| 6,780,337 B2 | 8/2004 | Goldbach | |
| 7,402,487 B2 | 7/2008 | Rennie | |
| 7,999,350 B2 | 8/2011 | Lu | |
| 2005/0124113 A1 | 6/2005 | Yoneda | |
| 2006/0267019 A1 | 11/2006 | Kim | |
| 2007/0284641 A1* | 12/2007 | Seo | H01L 28/91 257/532 |

FOREIGN PATENT DOCUMENTS

CN 1873987 A 12/2006

* cited by examiner

*Primary Examiner* — Jose R Diaz
(74) *Attorney, Agent, or Firm* — Cooper Legal Group, LLC

(57) ABSTRACT

A semiconductor structure, a preparation method of the same, and a semiconductor device are provided. The semiconductor structure includes a substrate, including an active area. A first electrode layer is arranged on the substrate and electrically connected to the active area. The first electrode layer extends in a direction perpendicular to the substrate. A dielectric layer is arranged on a surface of the first electrode layer. A second electrode layer is arranged on a surface of the dielectric layer. Each of the surface of the first electrode layer and the surface of the dielectric layer are provided with an uneven structure.

19 Claims, 18 Drawing Sheets

SEMICONDUCTOR STRUCTURE, PREPARATION METHOD OF SAME, AND SEMICONDUCTOR DEVICE

CROSS-REFERENCE TO RELATED APPLICATIONS

This is a continuation application of International Patent Application No. PCT/CN2021/100192, filed on Jun. 15, 2021, which claims priority to Chinese Patent Application No. 202110098759.8, filed on Jan. 25, 2021, entitled "Semiconductor Structure, Preparation Method of Same, and Semiconductor Device". The disclosures of International Patent Application No. PCT/CN2021/100192 and Chinese Patent Application No. 202110098759.8 are incorporated by reference herein in their entireties.

BACKGROUND

A capacitor is an important device of a Dynamic Random Access Memory (DRAM). The performance of the capacitor affects the storage performance of the DRAM.

With the increase of an integration level of the DRAM and continuous shrinking of a process, an area of a unit capacitor and a distance between unit capacitors are gradually reduced, so it is necessary to ensure that the capacitor may provide enough capacitance in a limited space to maintain signal strength of the DRAM. A capacitor usually includes an upper electrode plate, a dielectric, and a lower electrode plate. When the capacitor is a columnar capacitor, the upper electrode plate and the lower electrode plate form an inside surface and an outside surface of a column respectively, and the dielectric is arranged between the upper electrode plate and the lower electrode plate. A length of the column is increased to enlarge a surface area of the capacitor, thereby increasing the number of charges stored in the capacitor.

However, a present capacitance improving manner is easy to cause relatively low capacitor stability and bring the problem of contact due to capacitor toppling, thereby affecting the storage performance of the DRAM.

SUMMARY

The disclosure relates to the technical field of semiconductor manufacturing, and particularly to a semiconductor structure, a preparation method of the same, and a semiconductor device.

According to a first aspect, the disclosure provides a semiconductor structure, which may include a substrate, a first electrode layer, a dielectric layer, and a second electrode layer.

The substrate may include an active area.

The first electrode layer may be arranged on the substrate and electrically connected to the active area. The first electrode layer may extend in a direction perpendicular to the substrate.

The dielectric layer may be arranged on a surface of the first electrode layer.

The second electrode layer may be arranged on a surface of the dielectric layer.

Each of the surface of the first electrode layer and the surface of the dielectric layer may be provided with an uneven structure.

According to a second aspect, the disclosure provides a preparation method of a semiconductor structure, which may include the following operations.

A substrate is provided, the substrate including an active area.

A sacrificial layer with a hollow cavity is formed, the sacrificial layer being located on the substrate, and an inner sidewall surface of the hollow cavity having an uneven structure.

A first electrode layer is formed, the first electrode layer being on the inner sidewall surface of the hollow cavity, a surface of the first electrode layer having an uneven structure, and the first electrode layer being electrically connected to the active area.

The sacrificial layer is removed.

A dielectric layer is formed, the dielectric layer being located on the surface of the first electrode layer.

A second electrode layer is formed, the second electrode layer being located on a surface of the dielectric layer.

According to a third aspect, the disclosure provides a semiconductor device, which may include a substrate, transistors, word lines, bit lines, and semiconductor structures as described above.

The bit lines may be arranged on the substrate. The word lines may be arranged on the bit lines in a staggered manner A gate of the transistor may be connected with the word line. A source and a drain of the transistor may be formed in the active area of the substrate. The drain of the transistor may be connected with the bit line. The source of the transistor may be connected with the first electrode layer of the semiconductor structure.

BRIEF DESCRIPTION OF THE DRAWINGS

In order to describe the technical solutions in the embodiments of the disclosure or in the related art more clearly, the drawings required to be used in descriptions of the embodiments or the related art will be simply introduced below. It is apparent that the drawings described below are some embodiments of the disclosure. Other drawings may further be obtained by those of ordinary skill in the art according to these drawings without creative work.

DETAILED DESCRIPTION

Figure 1:
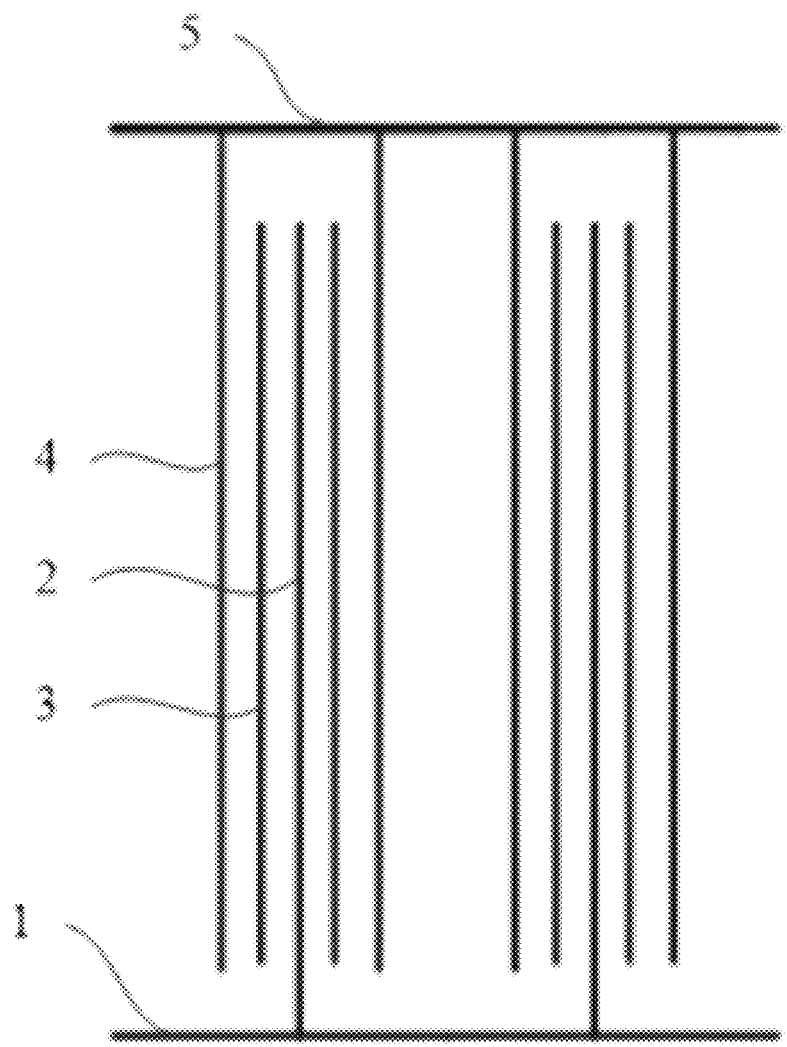
FIG. 1 is a structure diagram of a capacitor according to a related art.

FIG. 1 is a structure diagram of a capacitor according to the related art. Referring to FIG. 1, the inventor of the disclosure finds in a practical research process that an existing capacitor usually includes an upper electrode plate 4, a dielectric layer 3, and a lower electrode plate 2. When the capacitor is a columnar capacitor, the upper electrode plate 4 and the lower electrode plate 2 form an inside surface and an outside surface of a column respectively, and the dielectric layer 3 is arranged between the upper electrode plate 4 and the lower electrode plate 2. The capacitor is arranged on a substrate 1, the lower electrode plate 2 may be electrically connected to an active area of the substrate 1, and the upper electrode plate 4 may electrically connected to a common electrode layer 5, to implement electrical connection of the capacitor. In the existing capacitor, the upper electrode plate 4 and the lower electrode plate 2 are plane structures, and an area of an electrode of the capacitor is a plane area of the two plates. In such case, a length of the column is usually required to be increased to increase a surface area of the capacitor electrode for a purpose of increasing the number of charges stored in the capacitor. However, the structural stability of the columnar capacitor is reduced with the increase of the length of the columnar capacitor, and when the length of the columnar capacitor reaches a certain numerical value, there may be a risk that the columnar capacitor collapses or tilts, resulting in electrical contact between the upper electrode plate 4 and lower electrode plate 2 of the capacitor. Thus, this way of increasing the number of the charges in the capacitor in this manner has limitations, also affects the structural stability of the capacitor, and further affects the storage performance of a DRAM.

In view of this the disclosure provides a semiconductor structure, a preparation method of the same, and a semiconductor device. In this way, an area of an electrode in a semiconductor structure may be increased effectively, thereby improving capacitance and stability of the semiconductor structure and optimizing the storage performance of a semiconductor device.

To achieve the foregoing objective, according to a first aspect, the disclosure provides a semiconductor structure, which may include a substrate, a first electrode layer, a dielectric layer, and a second electrode layer.

The substrate may include an active area.

The first electrode layer may be arranged on the substrate and electrically connected to the active area. The first electrode layer may extend in a direction perpendicular to the substrate.

The dielectric layer may be arranged on a surface of the first electrode layer.

The second electrode layer may be arranged on a surface of the dielectric layer.

Each of the surface of the first electrode layer and the surface of the dielectric layer may be provided with an uneven structure.

According to the semiconductor structure provided in the disclosure, the substrate is provided to facilitate formation of the active area in the substrate and provision of a structure foundation for the subsequent semiconductor structure. The first electrode layer is provided, and the first electrode layer is electrically connected to the active area, so that electrical signal transmission between a source or a drain in the active area and the first electrode layer is facilitated. The dielectric layer is arranged on the surface of the first electrode layer, and the second electrode layer is formed on the surface of the dielectric layer, so that a capacitor structure of the semiconductor structure is formed using the first electrode layer, the dielectric layer, and the second electrode layer. The uneven structures are arranged on both the surface of the first electrode layer and the surface of the dielectric layer to help to increase a surface area of an electrode in the capacitor structure, thereby improving capacitance of the semiconductor structure.

In the semiconductor structure, optionally, multiple first protruding portions and multiple first recessed portions may be provided on a surface, on a side close to the dielectric layer, of the first electrode layer. The first protruding portions and the first recessed portions may be located on two opposite sides of a reference plane respectively, and the first protruding portions and the first recessed portions may be mutually staggered and sequentially connected end to end.

The first electrode layer may be cylindrical, the first electrode layer may have a median axis, the reference plane may be perpendicular to the substrate, and a distance between the reference plane and the median axis may be an average value of a distance between the first protruding portion and the median axis and a distance between the first recessed portion and the median axis.

Such an arrangement may reduce difficulties in arrangement of the uneven structure on the surface of the first electrode layer and help to increase a surface area of the first electrode layer.

In the semiconductor structure, optionally, the dielectric layer may be a concave-convex structure, the dielectric layer may include multiple first bending portions and multiple second bending portions. The first bending portions and the second bending portions may be located on two opposite sides of a first neutral plane respectively and bent in opposite directions, and the first bending portions and the second bending portions may be mutually staggered and sequentially connected end to end.

The first neutral plane may be perpendicular to the substrate, and a distance between the first neutral plane and the reference plane may be an average value of a distance between the first bending portion and the reference plane and a distance between the second bending portion and the reference plane.

Such an arrangement may reduce difficulties in arrangement of the dielectric layer, simultaneously increase the number of charges stored in the dielectric layer, and help to improve the capacitance of the semiconductor structure.

In the semiconductor structure, optionally, multiple second protruding portions and multiple second recessed portions may be provided on a surface, on a side close to the dielectric layer, of the second electrode layer, the second protruding portions and the second recessed portions may be located on two opposite sides of a second neutral plane respectively, and the second protruding portions and the second recessed portions may be mutually staggered and sequentially connected end to end.

The second neutral plane may be perpendicular to the substrate, and a distance between the second neutral plane and the reference plane may be an average value of a distance between the second protruding portion and the reference plane and a distance between the second recessed portion and the reference plane.

Such an arrangement may reduce difficulties in arrangement of an uneven structure on a surface of the second electrode layer and help to increase a surface area of the second electrode layer.

In the semiconductor structure, optionally, the first bending portions, the second bending portions, the first protruding portions, the first recessed portions, the second protruding portions, and the second recessed portions may all be arc-shaped or hemispheric.

Such an arrangement may avoid formation of sharp angle or dead angle structures in the first electrode layer, the dielectric layer, and the second electrode layer, improve the charge storage uniformity of a capacitor, and reduce current leakage.

In the semiconductor structure, optionally, a projection of the first electrode layer on the substrate may be a first ring, and a projection of the dielectric layer on the substrate may include a second ring and a third ring. The second ring is nested inside the first ring, and the third ring is sleeved outside the first ring.

A projection of the second electrode layer on the substrate may include a solid portion and a fourth ring. The solid portion is located inside the second ring, and the fourth ring is sleeved outside the third ring.

Such an arrangement facilitates formation of a stacked columnar structure by the first electrode layer, the dielectric layer, and the second electrode layer, and helps to increase the surface area of the electrode in the semiconductor structure, improve the stability of the semiconductor structure, and improve the capacitance of the semiconductor structure.

In the semiconductor structure, optionally, an electrical contact portion may be arranged between the first electrode layer and the active area, and the first electrode layer may be electrically connected with the active area through the electrical contact portion. Such an arrangement may reduce difficulties in electrical connection arrangement of the first electrode layer and the active area in the semiconductor structure and facilitate an electrical signal access process of the semiconductor structure.

In the semiconductor structure, optionally, a common electrode layer may be arranged on a side, away from the substrate, of the second electrode layer, and the second electrode layer may be electrically connected to the common electrode layer. Such an arrangement may reduce difficulties in electrical connection arrangement of the second electrode layer in the semiconductor structure and facilitate the electrical signal access process of the semiconductor structure.

In the semiconductor structure, optionally, a material for the first electrode layer may include a combination of one or more of tungsten, titanium, nickel, cobalt, titanium nitride, or tungsten nitride.

In the semiconductor structure, optionally, a material for the second electrode layer may include a combination of one or more of silicon, germanium, a silicon-germanium compound, tungsten, titanium, nickel, cobalt, titanium nitride, or tungsten nitride.

In the semiconductor structure, optionally, a material for the dielectric layer may include a combination of one or more of hafnium oxide, zirconia, or zirconium aluminum oxide.

According to a second aspect, the disclosure provides a preparation method of a semiconductor structure, which may include the following operations.

A substrate is provided, the substrate including an active area.

A sacrificial layer with a hollow cavity is formed, the sacrificial layer being located on the substrate, and an inner sidewall surface of the hollow cavity having an uneven structure.

A first electrode layer is formed, the first electrode layer being on the inner sidewall surface of the hollow cavity, a surface of the first electrode layer having an uneven structure, and the first electrode layer being electrically connected to the active area.

The sacrificial layer is removed.

A dielectric layer is formed, the dielectric layer being located on the surface of the first electrode layer.

A second electrode layer is formed, the second electrode layer being located on a surface of the dielectric layer.

According to the preparation method of the semiconductor structure in the disclosure, the substrate is provided, and the active area is formed in the substrate, so that provision of a structure foundation for the subsequent semiconductor structure is facilitated. The sacrificial layer with the hollow cavity is formed on the substrate, and the first electrode layer is arranged on the inner sidewall surface of the hollow cavity, so that the same uneven structure is formed on the surface of the first electrode layer using the uneven structure on the inner sidewall surface of the hollow cavity. Moreover, the first electrode layer is electrically connected to the active area, so that electrical signal transmission between a source or a drain in the active area and the first electrode layer is facilitated. The dielectric layer is arranged on the surface of the first electrode layer, and the second electrode layer is formed on the surface of the dielectric layer, so that a capacitor structure of the semiconductor structure is formed using the first electrode layer, the dielectric layer, and the second electrode layer. The uneven structures on the surface of the first electrode layer and the surface of the dielectric layer help to increase a surface area of an electrode in the capacitor structure, thereby improving capacitance of the semiconductor structure.

In the preparation method of the semiconductor structure, optionally, the operation that the sacrificial layer with the hollow cavity is formed, the sacrificial layer being located on the substrate, and the inner sidewall surface of the hollow cavity having the uneven structure, may specifically include the following operations.

A sacrificial layer is formed, the sacrificial layer being located on the substrate, and a material for the sacrificial layer being different from a material for the substrate.

The sacrificial layer is etched to form a columnar hollow cavity in the sacrificial layer.

The inner sidewall surface of the hollow cavity is treated to form the uneven structure on the inner sidewall surface of the hollow cavity.

Such an arrangement may help to form the uneven structure on the inner sidewall surface of the hollow cavity and reduce difficulties in formation of the uneven structure on the first electrode layer.

In the preparation method of the semiconductor structure, optionally, the operation that the inner sidewall surface of the hollow cavity is treated to form the uneven structure on the inner sidewall surface of the hollow cavity may specifically include the following operations.

A photoresist layer is formed, the photoresist layer being located on the inner sidewall surface of the hollow cavity.

The photoresist layer is exposed to light to form an uneven structure on the photoresist layer.

The inner sidewall surface of the hollow cavity is etched to form a same uneven structure on the inner sidewall surface of the hollow cavity as the photoresist layer.

Such an arrangement may form the uneven structure on the inner sidewall surface of the hollow cavity using a standing wave effect in an exposure treatment process and reduce difficulties in formation of the uneven structure.

According to a third aspect, the disclosure provides a semiconductor device, which may include a substrate, transistors, word lines, bit lines, and semiconductor structures as described above.

The bit lines may be arranged on the substrate. The word lines may be arranged on the bit lines in a staggered manner A gate of the transistor may be connected with the word line. A source and a drain of the transistor may be formed in the active area of the substrate. The drain of the transistor may be connected with the bit line. The source of the transistor may be connected with the first electrode layer of the semiconductor structure.

The semiconductor structure in the semiconductor device is mainly configured to store data. A gate of a transistor is connected with a word line, a drain of the transistor is connected with a bit line, and a source of the transistor is connected with the first electrode layer of the semiconductor structure, so that the word line may conveniently control the transistor to be turned on or turned off, to further read data information stored in the semiconductor structure through the bit line or write data information to the semiconductor structure for storage through the bit line, thereby implementing data access of the semiconductor device. The improvement of the semiconductor structure helps to improve the access performance of the semiconductor device.

In order to make the purposes, technical solutions, and advantages of the disclosure clearer, the technical solutions in the embodiments of the disclosure will be described below in more detail in combination with the drawings in the preferred embodiments of the disclosure. The same or similar reference signs throughout the drawings represent the same or similar components or components with the same or similar functions. The described embodiments are part of, but not all of embodiments of the disclosure. The embodiments described below with reference to the drawings are exemplary and intended to explain the disclosure and should not be understood as limitation to the disclosure. All other embodiments obtained by those of ordinary skill in the art based on the embodiments in the disclosure without creative work shall fall within the scope of protection of the disclosure. The embodiments of the disclosure will be described in detail below in combination with the drawings.

Figure 2:
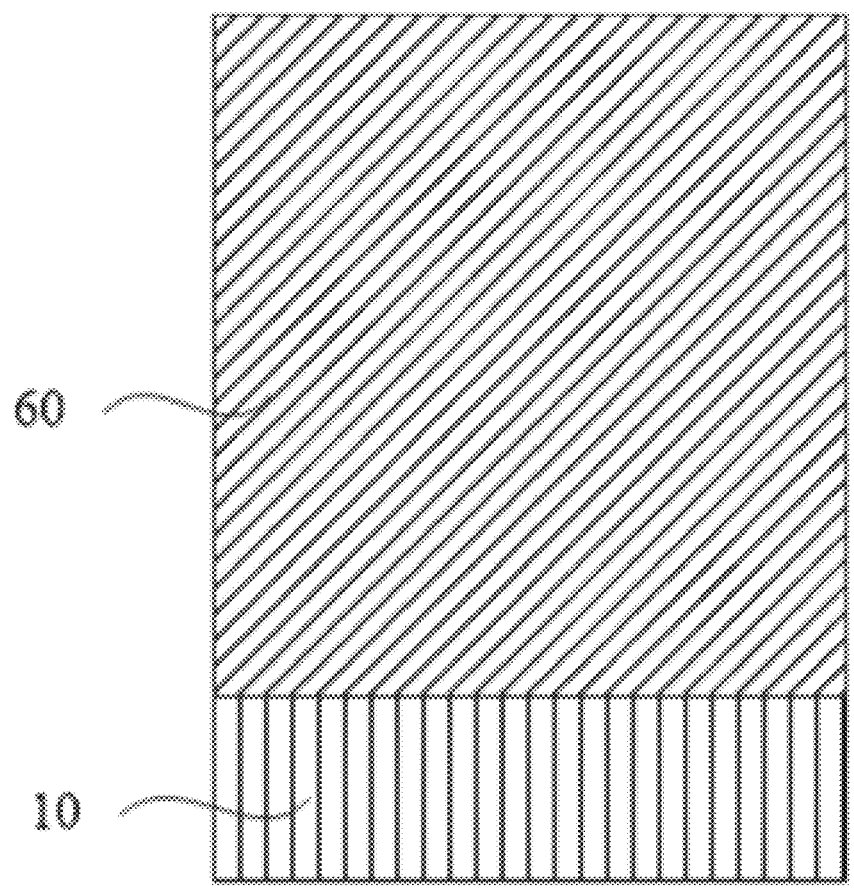
FIG. 2 is a structure diagram of a sacrificial layer of a semiconductor structure on a substrate according to an embodiment of the disclosure.
Figure 3:
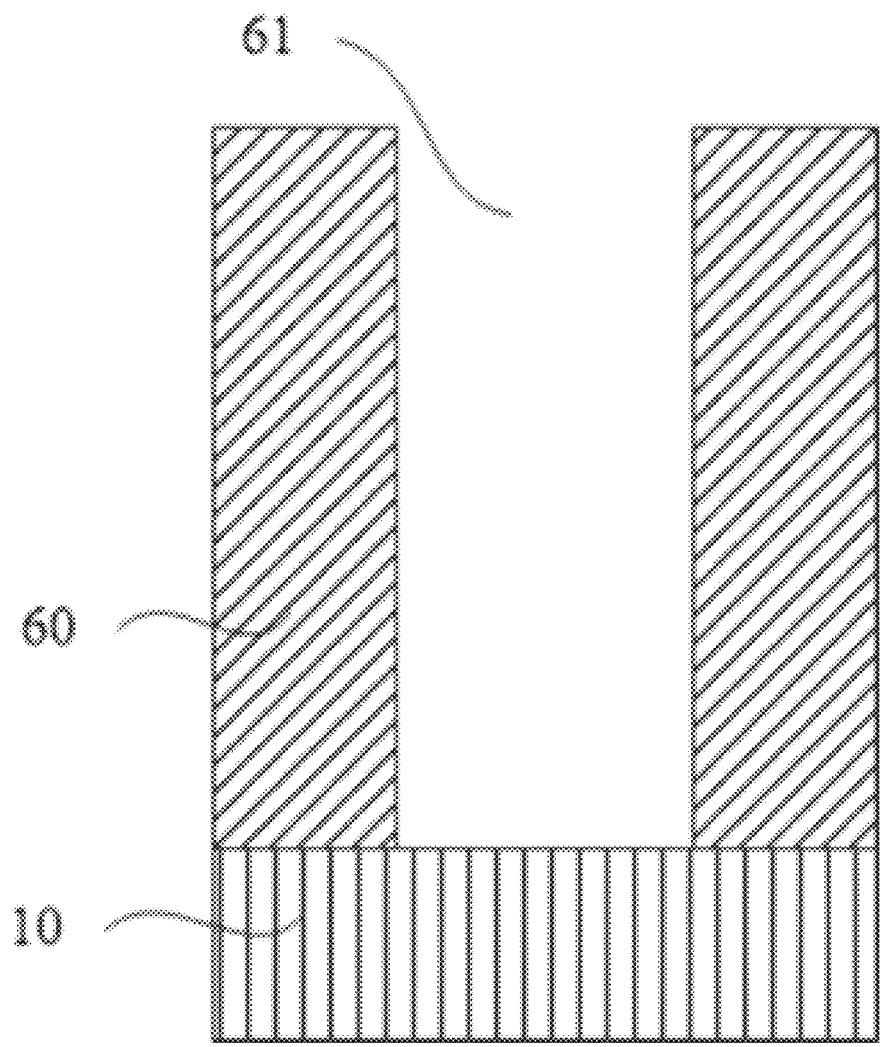
FIG. 3 is a structure diagram illustrating forming a hollow cavity in a sacrificial layer of a semiconductor structure according to an embodiment of the disclosure.
Figure 4:
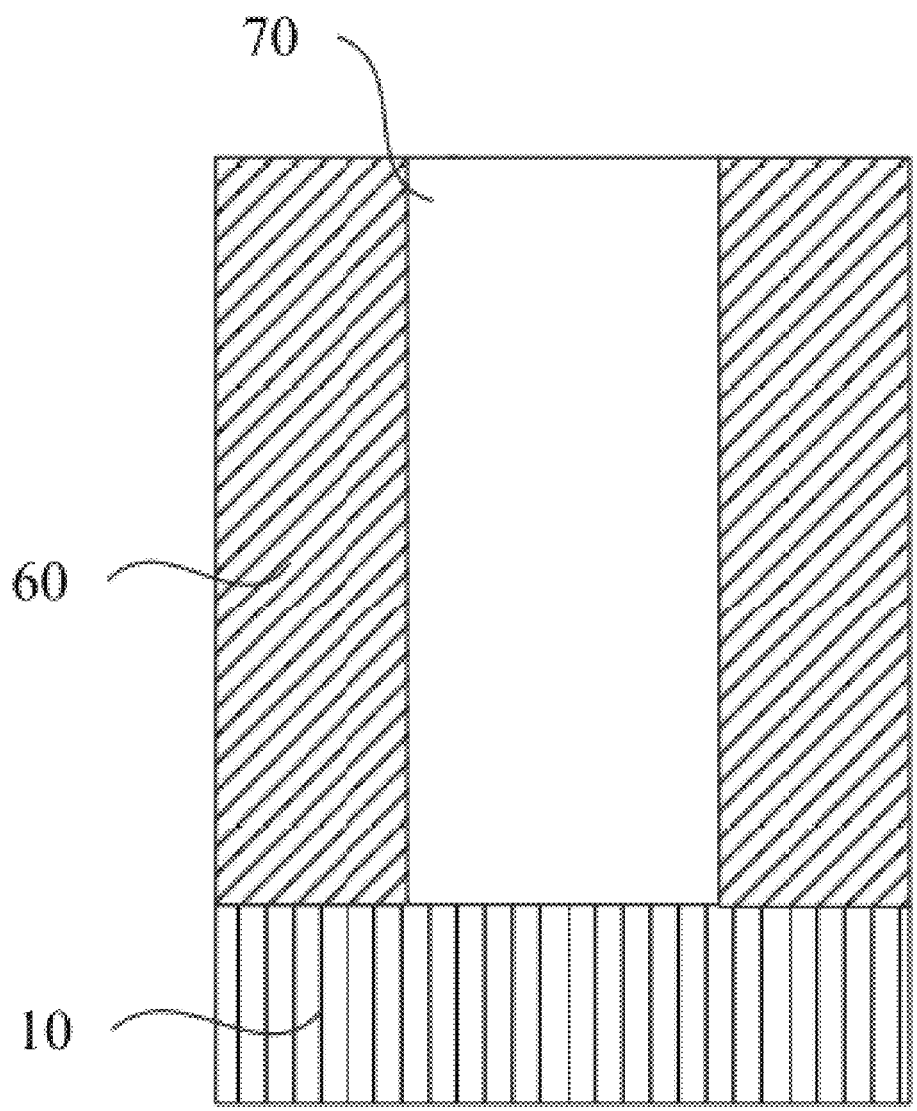
FIG. 4 is a structure diagram illustrating forming a photoresist layer on an inner sidewall surface of a hollow cavity of a sacrificial layer of a semiconductor structure according to an embodiment of the disclosure.
Figure 5:
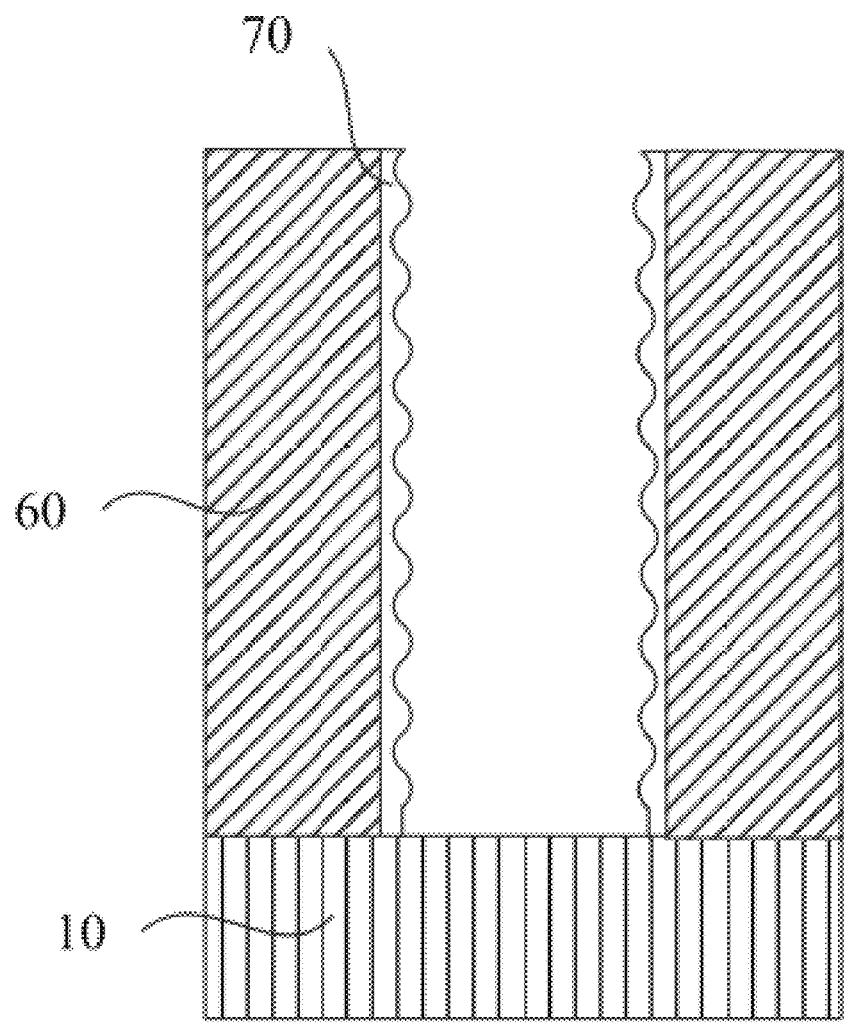
FIG. 5 is a structure diagram of a photoresist layer, after exposure processing, in a sacrificial layer of a semiconductor structure according to an embodiment of the disclosure.
Figure 6:
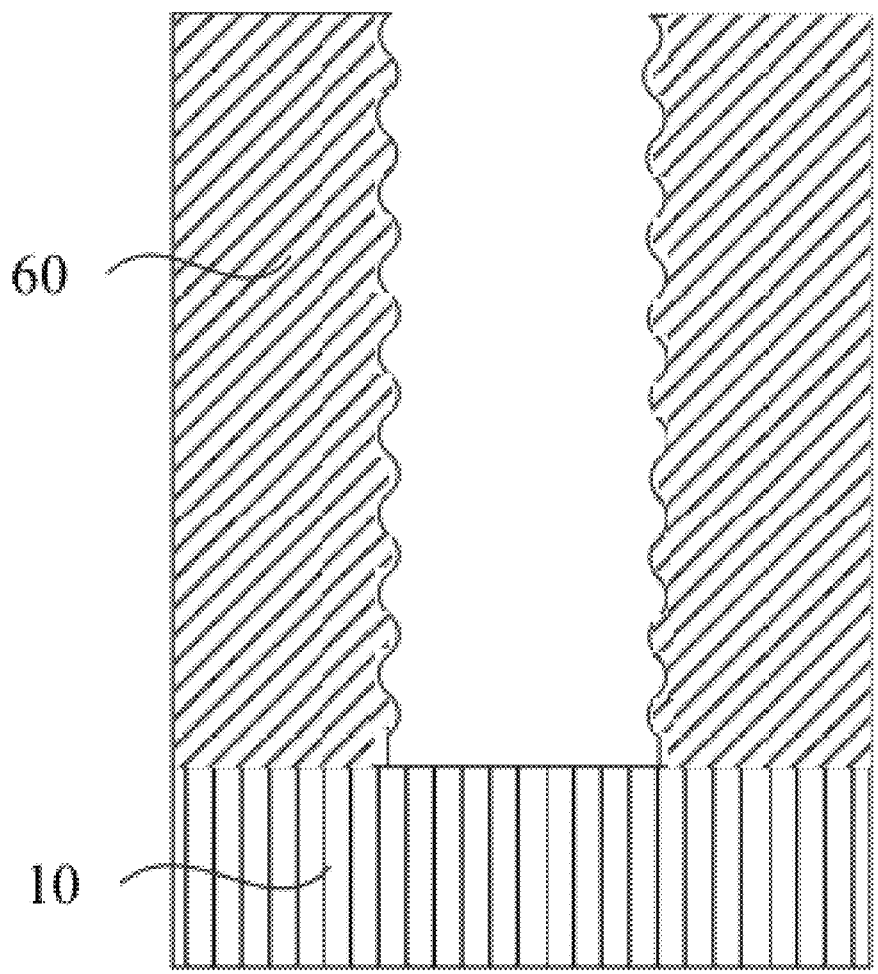
FIG. 6 is a structure diagram illustrating forming an uneven structure on an inner sidewall surface of a hollow cavity of a sacrificial layer of a semiconductor structure according to an embodiment of the disclosure.
Figure 7:
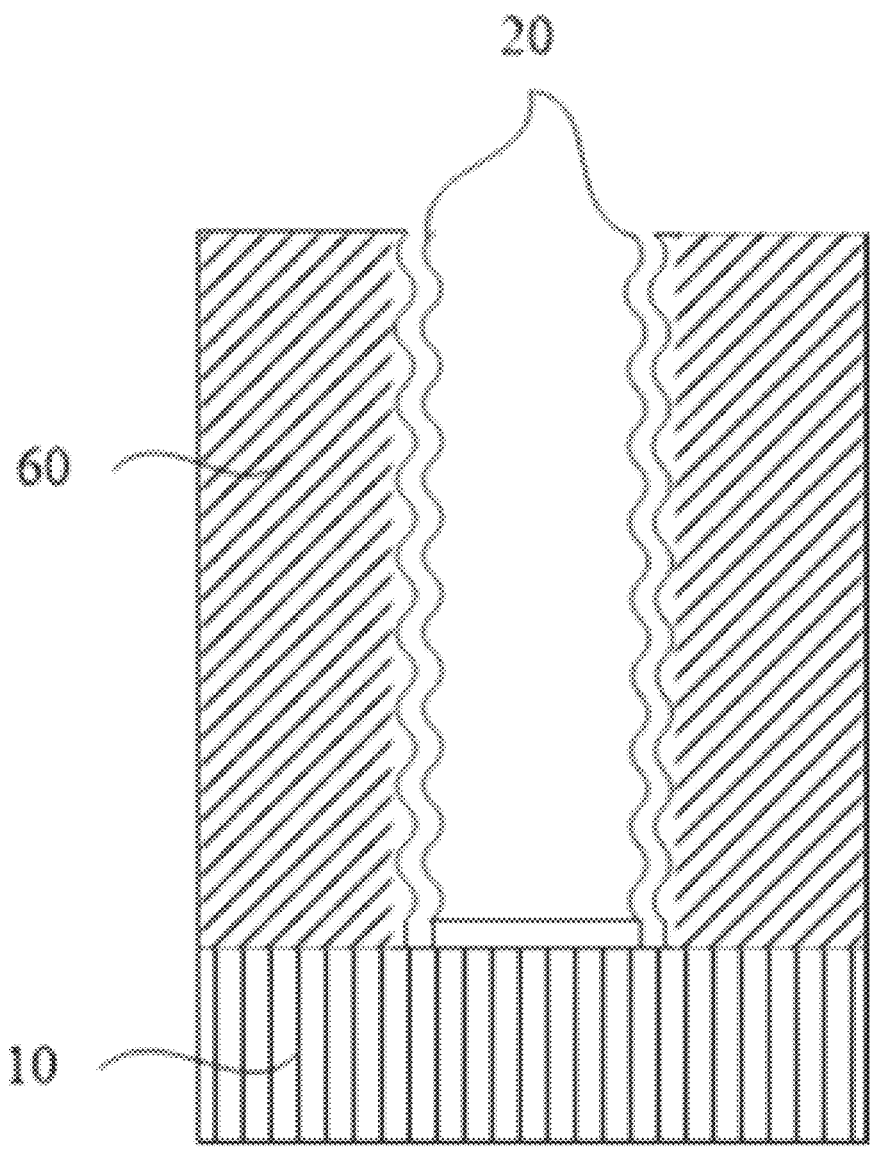
FIG. 7 is a structure diagram illustrating forming a first electrode layer on an inner sidewall surface of a hollow cavity of a sacrificial layer of a semiconductor structure according to an embodiment of the disclosure.
Figure 8:
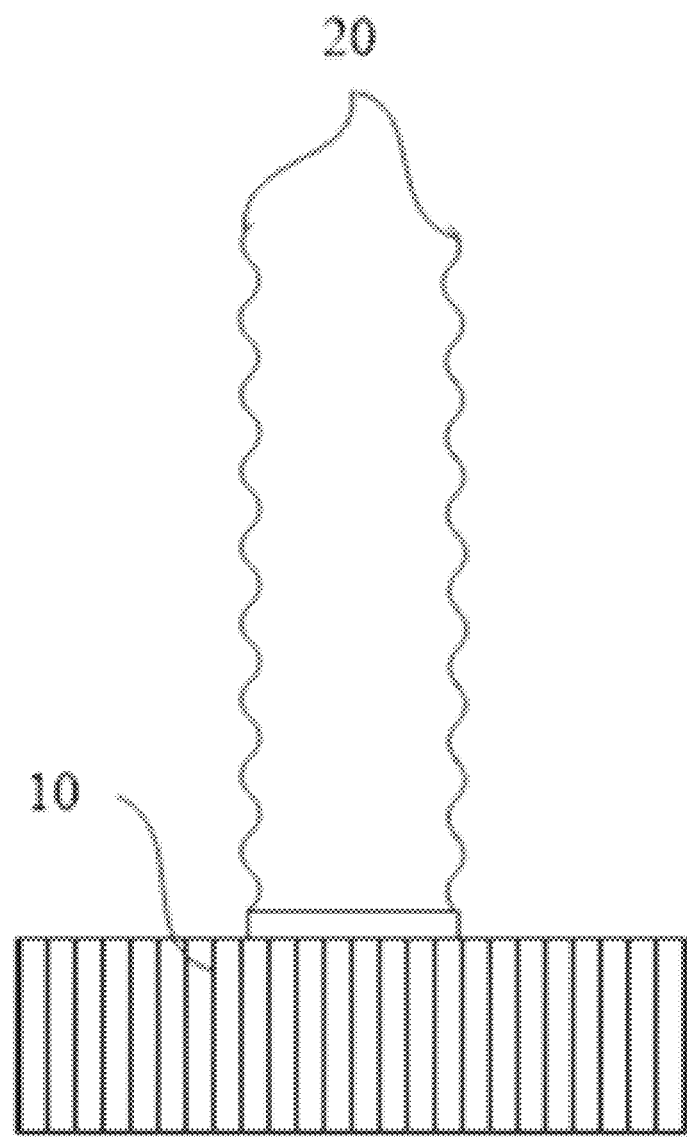
FIG. 8 is a structure diagram of a first electrode layer of a semiconductor structure on a substrate according to an embodiment of the disclosure.
Figure 9:
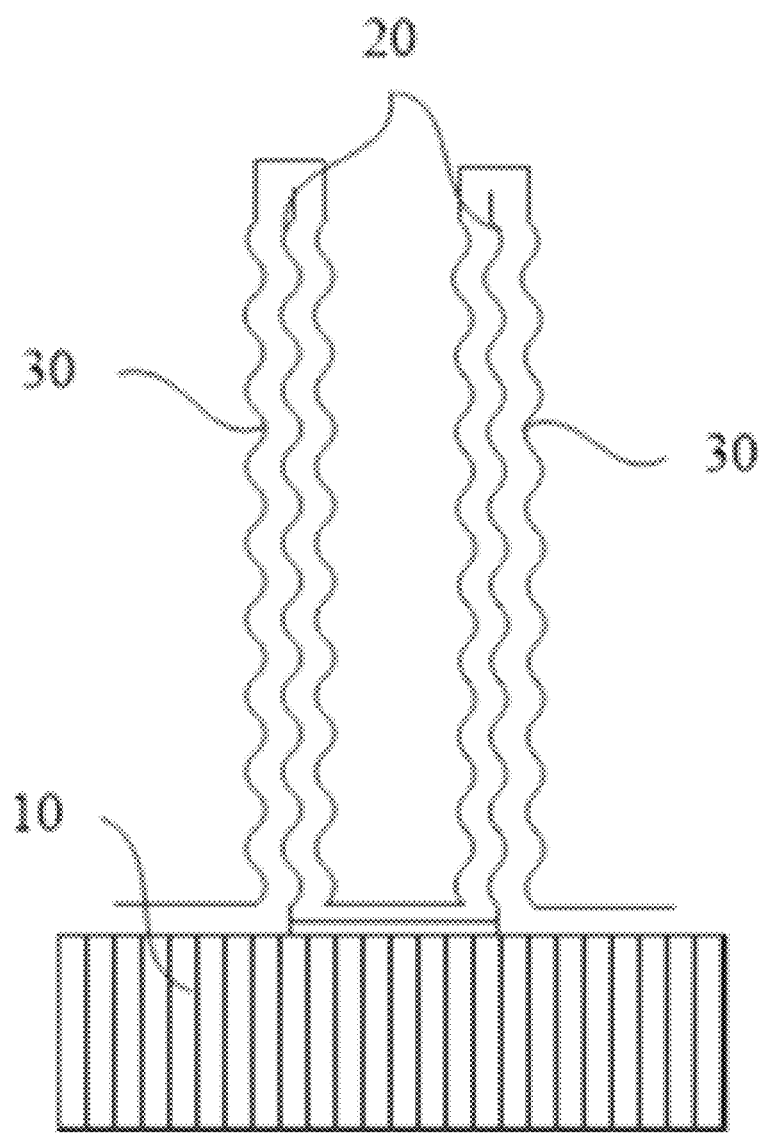
FIG. 9 is a structure diagram illustrating forming a dielectric layer on a surface of a first electrode layer of a semiconductor structure according to an embodiment of the disclosure.
Figure 10:
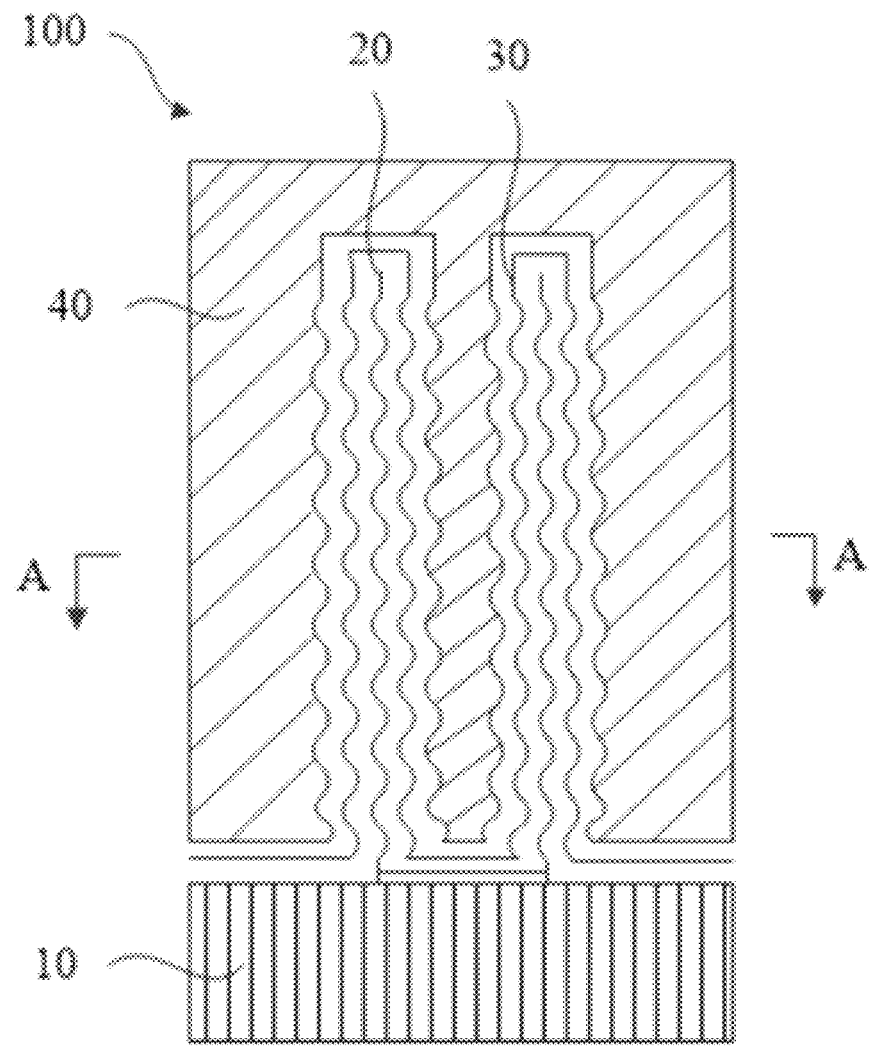
FIG. 10 is a structure diagram of a semiconductor structure according to an embodiment of the disclosure.
Figure 11:
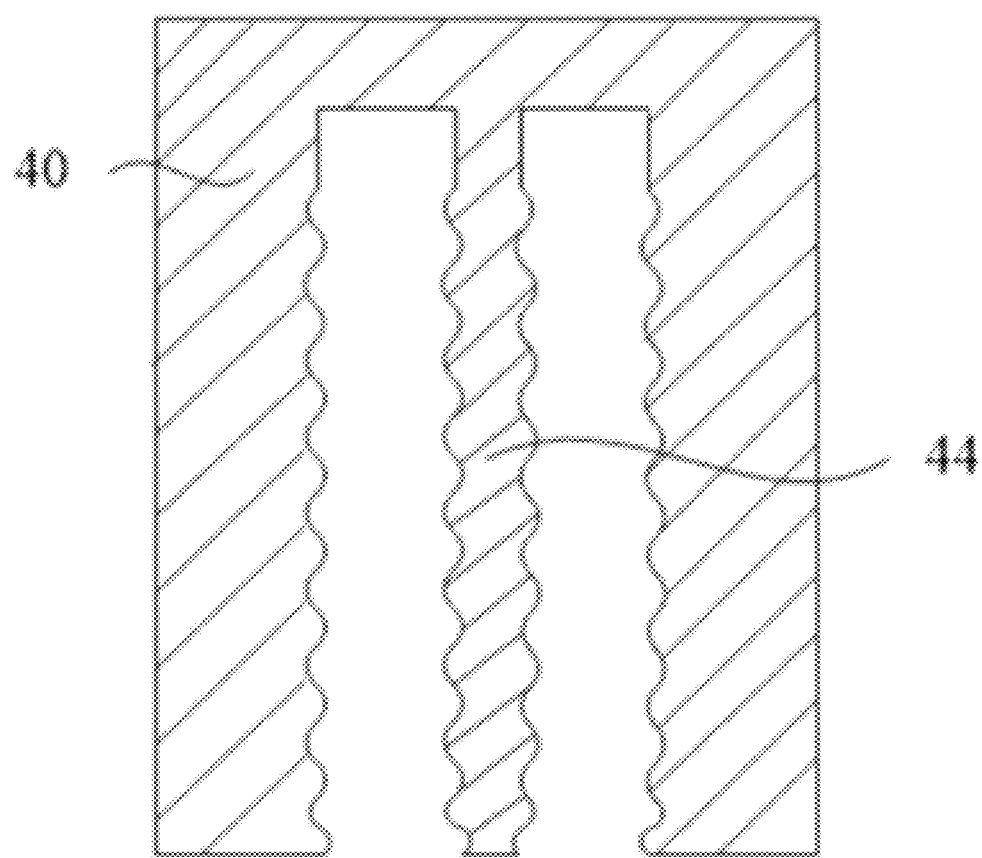
FIG. 11 is a structure diagram of a second electrode layer of a semiconductor structure on a substrate according to an embodiment of the disclosure.
Figure 12:
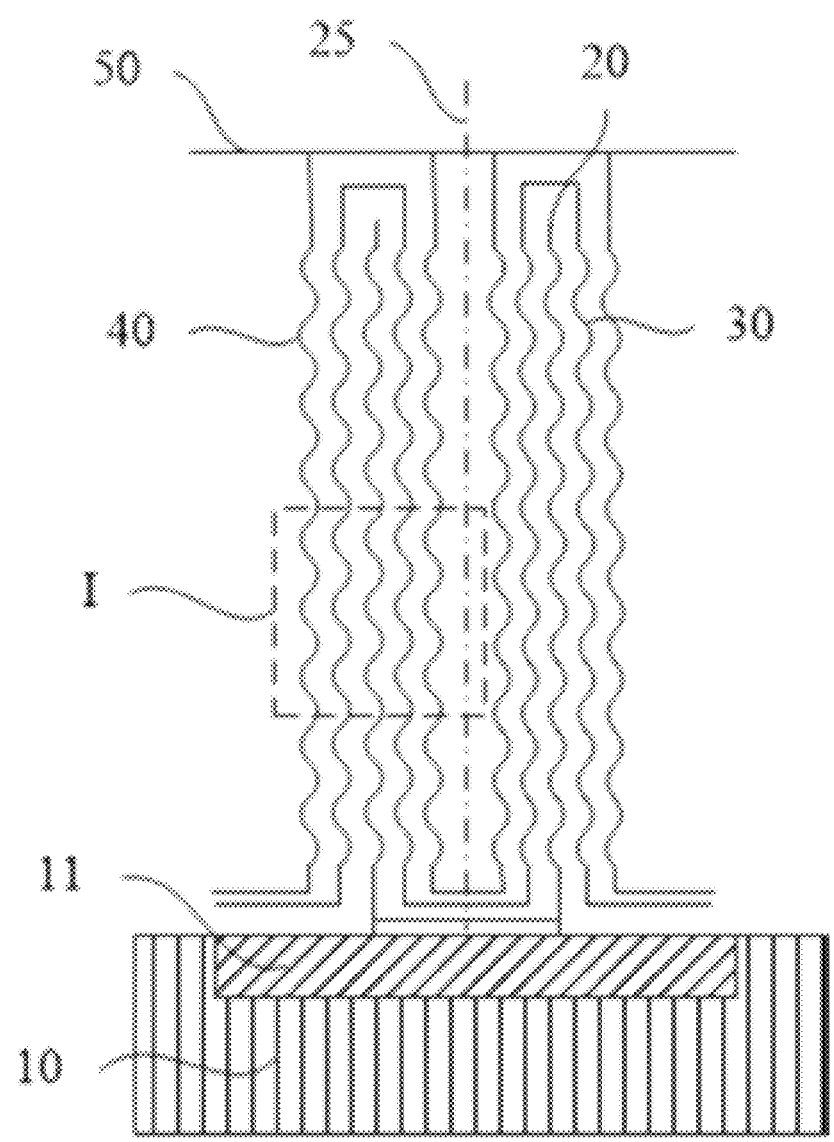
FIG. 12 is a structure diagram illustrating a connection of a semiconductor structure with an active area and a common electrode layer according to an embodiment of the disclosure.
Figure 13:
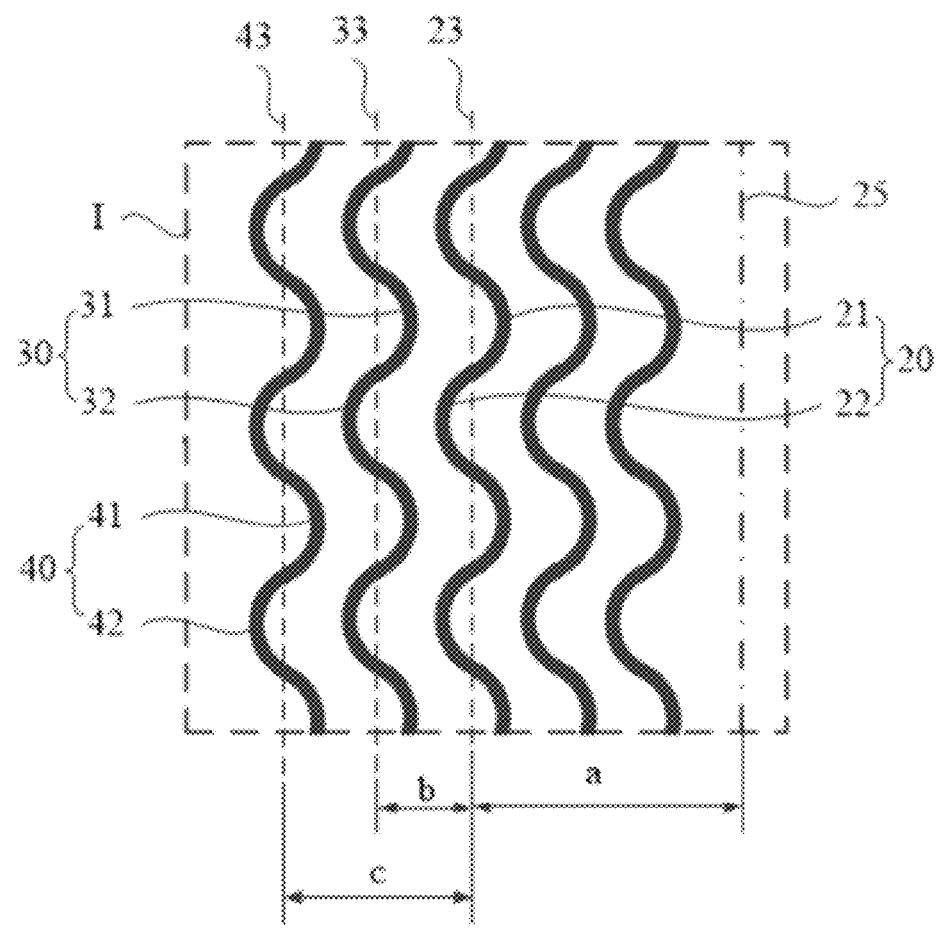
FIG. 13 is a partial structure diagram of part I in FIG. 12 according to an embodiment of the disclosure.
Figure 14:
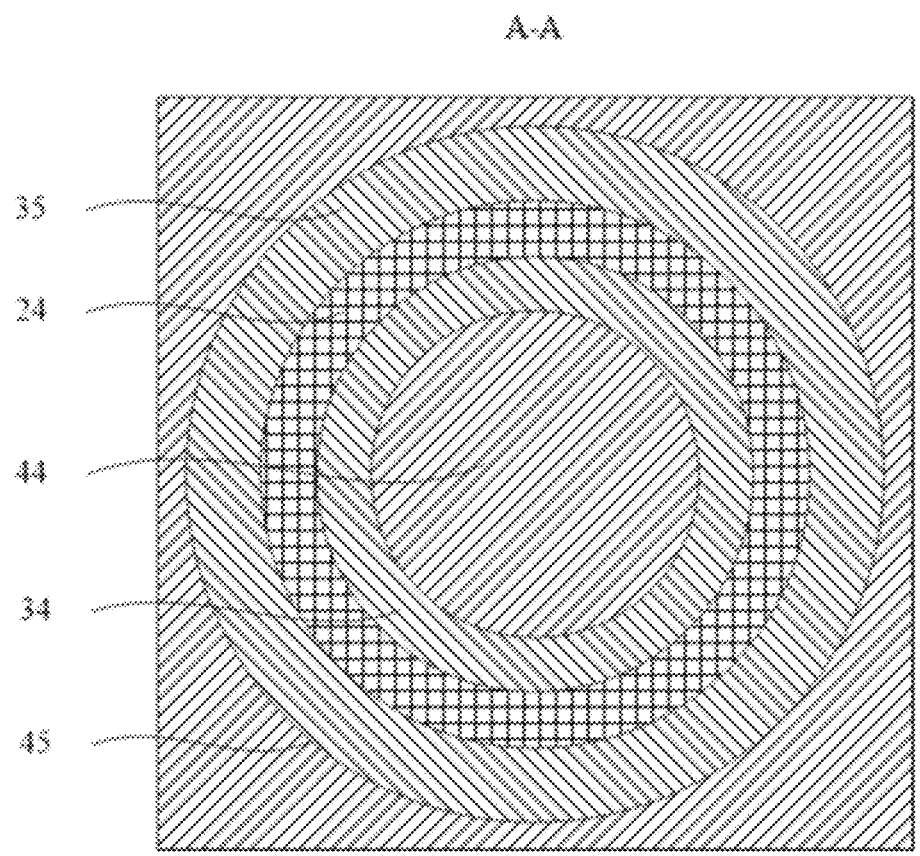
FIG. 14 is a structure diagram of section A-A in FIG. 10 according to an embodiment of the disclosure.
Figure 15:
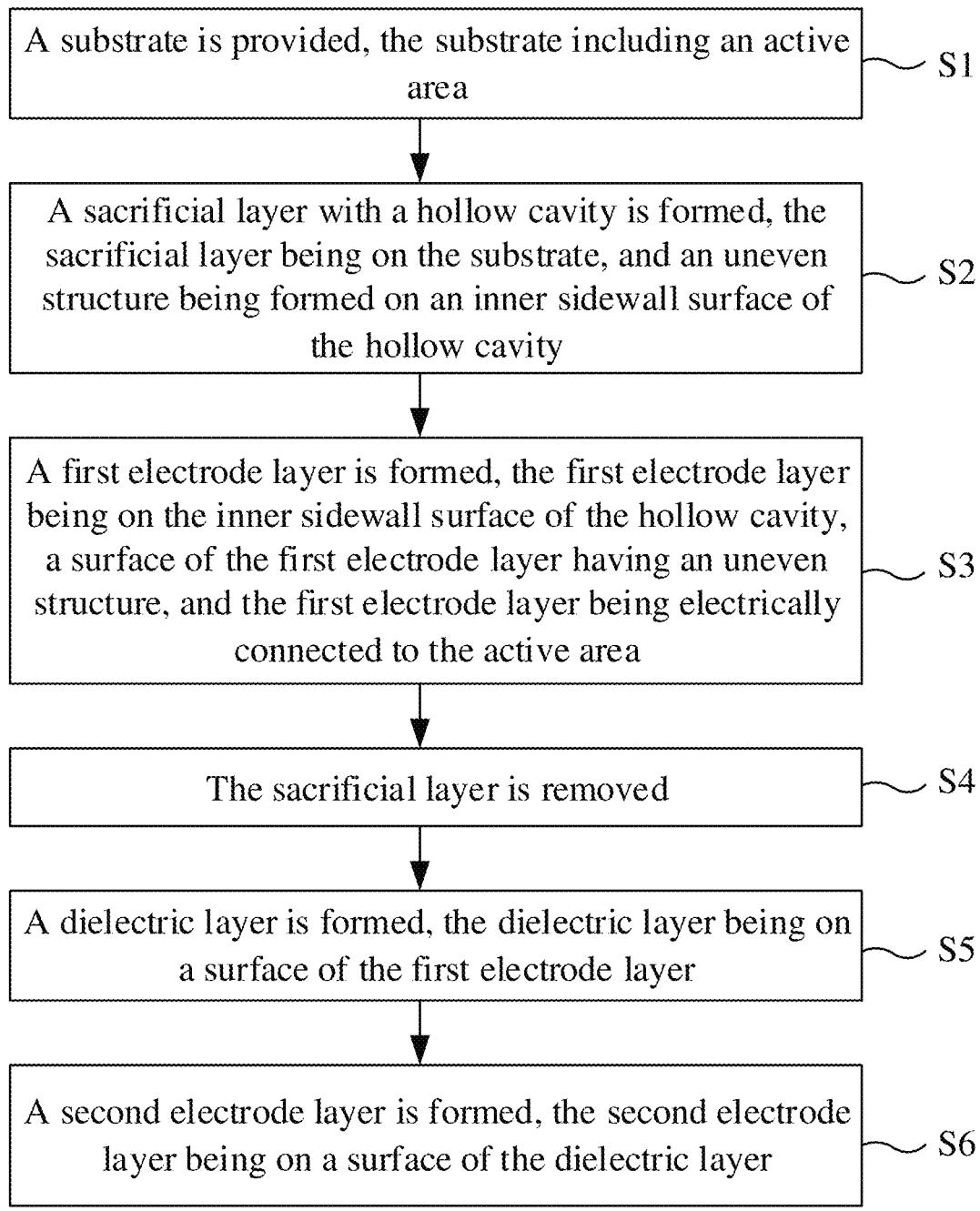
FIG. 15 is a flowchart of a preparation method of a semiconductor structure according to an embodiment of the disclosure.
Figure 16:
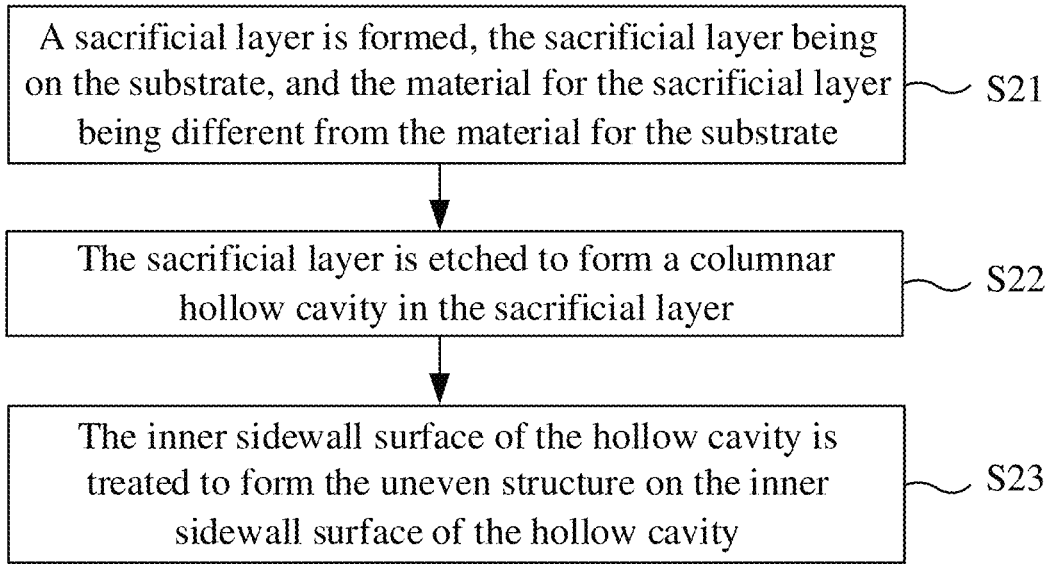
FIG. 16 is a flowchart of forming an uneven structure on an inner sidewall surface of a hollow cavity of a sacrificial layer in a preparation method of a semiconductor structure according to an embodiment of the disclosure.
Figure 17:
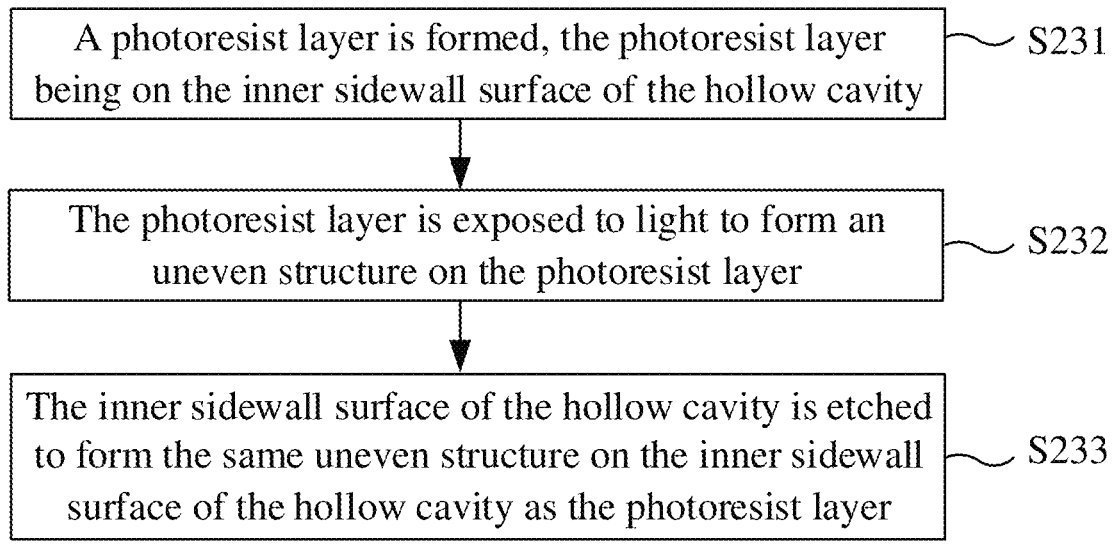
FIG. 17 is a flowchart of treating an inner sidewall surface of a hollow cavity in a preparation method of a semiconductor structure according to an embodiment of the disclosure.
Figure 18:
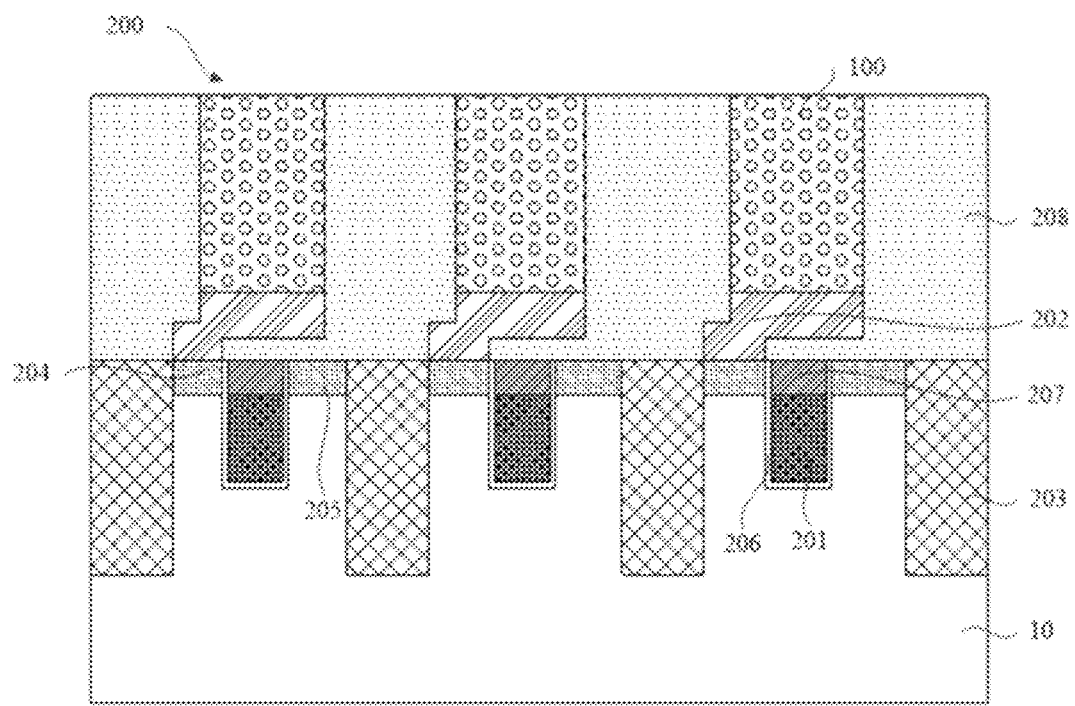
FIG. 18 is a structure diagram of a semiconductor device according to an embodiment of the disclosure.

FIG. 2 is a structure diagram of a sacrificial layer of a semiconductor structure on a substrate according to an embodiment of the disclosure. FIG. 3 is a structure diagram illustrating forming a hollow cavity in a sacrificial layer of a semiconductor structure according to an embodiment of the disclosure. FIG. 4 is a structure diagram illustrating forming a photoresist layer on an inner sidewall surface of a hollow cavity of a sacrificial layer of a semiconductor structure according to an embodiment of the disclosure. FIG. 5 is a structure diagram of a photoresist layer, after exposure processing, in a sacrificial layer of a semiconductor structure according to an embodiment of the disclosure. FIG. 6 is a structure diagram illustrating forming an uneven structure on an inner sidewall surface of a hollow cavity of a sacrificial layer of a semiconductor structure according to an embodiment of the disclosure. FIG. 7 is a structure diagram illustrating forming a first electrode layer on an inner sidewall surface of a hollow cavity of a sacrificial layer of a semiconductor structure according to an embodiment of the disclosure. FIG. 8 is a structure diagram of a first electrode layer of a semiconductor structure on a substrate according to an embodiment of the disclosure. FIG. 9 is a structure diagram illustrating forming a dielectric layer on a surface of a first electrode layer of a semiconductor structure according to an embodiment of the disclosure. FIG. 10 is a structure diagram of a semiconductor structure according to an embodiment of the disclosure. FIG. 11 is a structure diagram of a second electrode layer of a semiconductor structure on a substrate according to an embodiment of the disclosure. FIG. 12 is a structure diagram illustrating connecting a semiconductor structure with an active area and a common electrode layer according to an embodiment of the disclosure. FIG. 13 is a partial structure diagram of part I in FIG. 12 according to an embodiment of the disclosure. FIG. 14 is a structure diagram of section A-A in FIG. 10 according to an embodiment of the disclosure. FIG. 15 is a schematic flowchart of a preparation method of a semiconductor structure according to an embodiment of the disclosure. FIG. 16 is a schematic flowchart of forming an uneven structure on an inner sidewall surface of a hollow cavity of a sacrificial layer in a preparation method of a semiconductor structure according to an embodiment of the disclosure. FIG. 17 is a schematic flowchart of treating an inner sidewall surface of a hollow cavity in a preparation method of a semiconductor structure according to an embodiment of the disclosure. FIG. 18 is a structure diagram of a semiconductor device according to an embodiment of the disclosure.

Referring to FIG. 2 to FIG. 18, an embodiment of the disclosure provides a semiconductor structure 100, which includes the following portions.

A substrate 10 includes an active area 11. A first electrode layer 20 is provided on the substrate 10 and electrically connected to the active area 11. The first electrode layer 20 extends in a direction perpendicular to the substrate 10. A dielectric layer 30 is provided on a surface of the first electrode layer 20. A second electrode layer 40 is provided on a surface of the dielectric layer 30.

Both the surface of the first electrode layer 20 and the surface of the dielectric layer 30 are provided with uneven structures.

It is to be noted that the semiconductor structure 100 provided in the embodiment may be a capacitor in a semiconductor device, and the semiconductor device may be a DRAM. The substrate 10 in the embodiment may be monocrystalline silicon, polycrystalline silicon, amorphous silicon, a silicon-germanium compound, Silicon-On-Insulator (SOI), or another material known to those skilled in the art. The substrate 10 may provide a supporting foundation for the other structural layers on the substrate 10. There are semiconductor layers in the substrate 10. The semiconductor layers may be formed by doping. According to different types of doped particles, the doped semiconductor layers may be divided into type N and type P. There may be formed the active area 11 in the semiconductor layer. The active area 11 may include a source region and a drain region. The source region is connected with the drain region through a trench region. When there is current conducted in the trench region, the source region and drain region of the active area 11 are electrically connected. The substrate 10 may also be a broader concept. For example, the substrate 10 may further include a landing pad, a storage node contact, the dielectric layer, the active area 11, etc. The storage node contact penetrates through the dielectric layer. The landing pad is electrically connected with the active area 11 through the storage node contact. The first electrode layer 20 is electrically connected to the active area 11 through the landing pad and the storage node contact.

As shown in FIG. 18, the first electrode layer 20 is arranged on the substrate 10 and electrically connected with the active area 11, and may be electrically connected with the source region or drain region of the active area 11. Specifically, an electrical contact portion 202 is arranged between the first electrode layer 20 and the active area 11, and the first electrode layer 20 is electrically connected with the active area 11 through the electrical contact portion 202.

Based on application of the semiconductor structure 100 to the semiconductor device, the substrate 10 does not in contact directly with the first electrode layer 20, and there may be another layer structure arranged between the substrate and the first electrode layer, so connection therebetween may be implemented using the electrical contact portion 202. One end of the electrical contact portion 202 is electrically connected with the first electrode layer 20, and the other end of the electrical contact portion 202 is electrically connected with the active area 11 in the substrate 10 after penetrating through the another layer structure between the substrate 10 and the first electrode layer 20. The electrical contact portion 202 may be a node contact. Such an arrangement may reduce difficulties in electrical connection arrangement of the first electrode layer 20 and the active area 11 in the semiconductor structure 100 and facilitate an electrical signal access process of the semiconductor structure 100. Referring to FIG. 8, the first electrode layer 20 may be a cylindrical structure arranged on the substrate 10. The uneven structure is formed on the surface of the first electrode layer 20. The surface of the first electrode layer 20 may be an inner wall surface and an outer wall surface of the cylindrical first electrode layer 20.

Referring to FIG. 9, the dielectric layer 30 is located on the surface of the first electrode layer 20, and the dielectric layer may cover the inner wall surface and outer wall surface of the first electrode layer 20, and cover an end, on a side away from the substrate 10, of the first electrode layer 20. Based on the uneven structure of the first electrode layer 20, the dielectric layer 30 is formed with the uneven structure adapted to the uneven structure of the first electrode layer 20. Herein, the expression "adapted to" may refer to that the uneven structures of the first electrode layer 20 and the dielectric layer 30 are the same, both recessed positions and protruding positions have a correspondence relationship, and recessed depths or protruding depths may be the same.

The surface, on which the uneven structure is formed, of the dielectric layer 30 may refers to a surface, on a side close to the first electrode layer 20, of the dielectric layer 30 and a surface, on a side away from the first electrode layer 20, of the dielectric layer 30.

Furthermore, the dielectric layer 30 is between the first electrode layer 20 and the second electrode layer 40, and may be prepared from a material with a high dielectric constant. The dielectric layer 30 may stop movement of free charges between the first electrode layer 20 and the second electrode layer 40. The material for the dielectric layer 30 may include one of or mixture of more of hafnium oxide, zirconia, or zirconium aluminum oxide. In practical applications, a user may adjust the material for the dielectric layer 30 as needed, which is not limited in the embodiment.

Referring to FIG. 10, the second electrode layer 40 may further be arranged on the dielectric layer 30. The second electrode layer 40 may wrap around the dielectric layer 30. Based on the uneven structure formed on the surface, on the side close to the second electrode layer 40, of the dielectric layer 30, an adapted uneven structure may correspondingly be formed on a surface, on a side close to the dielectric layer 30, of the second electrode layer 40.

It is to be pointed out that based on that the uneven structures are formed on both the first electrode layer 20 and the second electrode layer 40, compared with the plane structures of the upper electrode plate 4 and lower electrode plate 2 of the capacitor in the related art, the uneven structures in the embodiment may effectively increase surface areas of the first electrode layer 20 and the second electrode layer 40 in a unit region and increase a surface area of the dielectric layer 30 in a unit region, to further increase the number of charges stored in the semiconductor structure 100. An increment of the surface area may be correlated with the unevenness of the uneven structure. In a certain range, by increasing the unevenness of the uneven structure, the increment of the surface area can be increased, thereby improving the capacitance of the semiconductor structure 100.

Specifically, as shown in FIG. 12 and FIG. 13, multiple first protruding portions 21 and multiple first recessed portions 22 are arranged on the surface, on the side close to the dielectric layer 30, of the first electrode layer 20. The first protruding portions 21 and the first recessed portions 22 are located on two opposite sides of a reference plane 23 respectively. The first protruding portions 21 and the first recessed portions 22 are mutually staggered and sequentially connected end to end.

The first electrode layer 20 is cylindrical. The first electrode layer 20 has a median axis 25. The reference plane 23 is perpendicular to the substrate 10. A distance between the reference plane 23 and the median axis 25 is an average value of a distance between the first protruding portion 21 and the median axis 25 and a distance between the first recessed portion 22 and the median axis 25.

It is to be noted that the median axis 25 of the first electrode layer 20 may be a central axis of the cylindrical structure and the distance between the reference plane 23 and the median axis 25 may be the part shown by a in FIG. 13. Based on that the first electrode layer 20 is the cylindrical structure, a three-dimensional structure of the reference plane 23 may also be cylindrical. The first protruding portion 21 may protrude toward one side of the reference plane 23, the first recessed portion 22 may be recessed toward the other side of the reference plane 23, and they are on the two opposite sides of the reference plane 23 respectively. The distance between the first protruding portion 21 and the median axis 25 may refer to a distance between a maximally bent position of the first protruding portion 21 and the median axis 25. Similarly, the distance between the first recessed portion 22 and the median axis 25 may be a distance between a maximally bent position of the first recessed portion 22 and the median axis 25. The average value of the two distances may be a.

Specifically, continuing to refer to FIG. 12 and FIG. 13, the dielectric layer 30 is a concave-convex structure. The dielectric layer 30 includes multiple first bending portions 31 and multiple second bending portions 32. The first bending portions 31 and the second bending portions 32 are on two opposite sides of a first neutral plane 33 respectively and are bent in opposite directions. The first bending portions 31 and the second bending portions 32 are mutually staggered and sequentially connected end to end. The first neutral plane 33 is perpendicular to the substrate 10. A distance between the first neutral plane 33 and the reference plane 23 is an average value of a distance between the first bending portion 31 and the reference plane 23 and a distance between the second bending portion 32 and the reference plane 23.

It is to be noted that the distance between the first neutral plane 33 and the reference plane 23 may be a part shown by b in FIG. 13. The first bending portion 31 may be bent toward one side of the first neutral plane 33, and the second bending portion 32 may be bent toward the other side of the first neutral plane 33, so that the first bending portion 31 and the second bending portion 32 are on the two opposite sides of the first neutral plane 33 respectively. The distance between the first bending portion 31 and the reference plane 23 may refer to a distance between a maximally bent position of the first bending portion 31 and the reference plane 23. The distance between the second bending portion 32 and the reference plane 23 may refer to a distance between a maximally bent position of the second bending portion 32 and the reference plane 23. The average value of the two distances may be b.

Specifically, continuing to refer to FIG. 12 and FIG. 13, multiple second protruding portions 41 and multiple second recessed portions 42 are arranged on a surface, on the side close to the dielectric layer 30, of the second electrode layer 40. The second protruding portions 41 and the second recessed portions 42 are on two opposite sides of a second neutral plane 43 respectively. The second protruding portions 41 and the second recessed portions 42 are mutually staggered and sequentially connected end to end. The second neutral plane 43 is perpendicular to the substrate 10. A distance between the second neutral plane 43 and the reference plane 23 is an average value of a distance between the second protruding portion 41 and the reference plane 23 and a distance between the second recessed portion 42 and the reference plane 23.

It is to be noted that the distance between the second neutral plane 43 and the reference plane 23 may be a part shown by c in FIG. 13. The second protruding portion 41 may protrude toward one side of the second neutral plane 43, and the second recessed portion 42 may be recessed toward the other side of the second neutral plane 43, so that the second protruding portion 41 and the second recessed portion 42 are on the two opposite sides of the second neutral plane 43 respectively. The distance between the second protruding portion 41 and the reference plane 23 may refer to a distance between a maximally bent position of the second protruding portion 41 and the reference plane 23. The distance between the second recessed portion 42 and the reference plane 23 may refer to a distance between a maximally bent position of the second recessed portion 42 and the reference plane 23. The average value of the two distances may be c.

The first bending portion 31, the second bending portion 32, the first protruding portion 21, the first recessed portion 22, the second protruding portion 41, and the second recessed portion 42 are all arc-shaped or hemispheric. It is to be noted that an arc shape or a hemispheric shape may ensure that there are no corner structures in the first electrode layer 20, the dielectric layer 30, and the second electrode layer 40. There is a small included angle or sharp angle position in a corner structure, so that charges are likely to be accumulated at the position, the uniformity of charges distributed between the first electrode layer 20 and the second electrode layer 40 is reduced, and meanwhile, the problem of current leakage may be brought to the semiconductor structure 100.

Furthermore, the first bending portion 31, the first protruding portion 21, and the second protruding portion 41 are all portions bent toward the same direction, and they may be bent in the same degree and are sequentially embedded together. Similarly, the second bending portion 32, the first recessed portion 22, and the second recessed portion 42 may all be bent toward the same direction, and they may be bent in the same degree and are sequentially embedded together. Such an arrangement may improve the structural matching degree of the first electrode layer 20, the dielectric layer 30, and the second electrode layer 40, thereby improving the structural stability of the semiconductor structure 100. Moreover, it is to be pointed out that, compared with the upper electrode plate 4, dielectric layer 3, and lower electrode plate 2 of plane structures in the related art, all of the first electrode layer 20, the dielectric layer 30, and the second electrode layer 40 include bent portions, so that thicknesses of the three layers are increased in a direction parallel to the substrate 10, which may improve the stability and solve the problem of the contact in the capacitor due to toppling.

As shown in FIG. 10 and FIG. 14, a projection of the first electrode layer 20 on the substrate 10 is a first ring 24. A projection of the dielectric layer 30 on the substrate 10 includes a second ring 34 and a third ring 35. The second ring 34 is nested inside the first ring 24, and the third ring 35 is sleeved outside the first ring 24. A projection of the second electrode layer 40 on the substrate 10 includes a solid portion 44 and a fourth ring 45. The solid portion 44 is positioned inside the second ring 34, and the fourth ring 45 is sleeved outside the third ring 35.

It is to be noted that the first electrode layer 20, the dielectric layer 30, and the second electrode layer 40 may form a structure having layers nested and overlapped layer by layer. As such, the corresponding areas of the first electrode layer 20 and the second electrode layer 40 in the semiconductor structure 100 may be increased to enlarge a charge storage region and improve a charge storage capacity. Moreover, the structure having layers nested and overlapped layer by layer may limit and fix inner-layer structures by outer-layer structures, so that the structural stability of the semiconductor structure 100 is improved.

The fourth ring 45 of the second electrode layer 40 is formed by a projection of an inner wall surface of the second electrode layer 40 on the substrate 10. An outer structure of the second electrode layer 40 may be configured according to a structure in the semiconductor device, which is not limited herein. The solid portion 44 of the second electrode layer 40 may be cylindrical as shown in FIG. 14, and in practical applications, may also be a polygonal columnar structure. A specific shape of the solid portion 44 is not limited in the embodiment.

It is to be pointed out that, in the embodiment, the projections of the first electrode layer 20, the dielectric layer 30, and the second electrode layer 40 on the substrate refer in particular to projections of parts at section A-A in FIG. 10 on the substrate 10.

Referring to FIG. 12, a common electrode layer 50 is arranged on a side, away from the substrate 10, of the second electrode layer 40, and the second electrode layer 40 is electrically connected to the common electrode layer 50. Such an arrangement may reduce difficulties in electrical connection arrangement of the second electrode layer 40 in the semiconductor structure 100 and facilitate the electrical signal access process of the semiconductor structure 100.

As a possible implementation mode, a material for the first electrode layer 20 includes one of or mixture of more of tungsten, titanium, nickel, cobalt, titanium nitride, or tungsten nitride. In practical applications, the user may adjust the specific material for the first electrode layer 20 as needed, which is not limited in the embodiment.

As a possible implementation mode, a material for the second electrode layer 40 includes one of or mixture of more of silicon, germanium, a silicon-germanium compound, tungsten, titanium, nickel, cobalt, titanium nitride, or tungsten nitride. In practical applications, the user may adjust the specific material for the second electrode layer 40 as needed, which is not limited in the embodiment.

Referring to FIG. 15 to FIG. 17 and FIG. 2 to FIG. 14, based on the above description, an embodiment of the disclosure also provides a preparation method of a semiconductor structure. The method may be used to prepare the above-mentioned semiconductor structure 100. Specifically, the preparation method of the semiconductor structure includes the following operations.

In S1, a substrate is provided, the substrate having an active area.

It is to be noted that the substrate 10 may provide a structure foundation for a subsequent sacrificial layer 60 and the semiconductor structure 100. A material for the substrate 10 and a manner for forming the active area 11 are described in the above-mentioned semiconductor structure 100, and will not be repeated herein.

In S2, a sacrificial layer with a hollow cavity is formed, the sacrificial layer being on the substrate, and an inner sidewall surface of the hollow cavity having an uneven structure.

It is to be noted that S2 may specifically include the following operations.

In S21, a sacrificial layer is formed, the sacrificial layer being on the substrate, and a material for the sacrificial layer being different from a material for the substrate.

Referring to FIG. 2, the sacrificial layer 60 may be formed on the substrate 10 by deposition, and a material for the sacrificial layer 60 may be different from a material for the substrate 10, to facilitate subsequent formation of the hollow cavity 61 in the sacrificial layer 60.

In S22, the sacrificial layer is etched to form a columnar hollow cavity in the sacrificial layer.

Referring to FIG. 3, etching may adopt dry etching, or wet etching, for example, chemical liquid etching. Based on that the material for the sacrificial layer 60 is different from the material for the substrate 10, chemical liquid that selectively etches the sacrificial layer 60 may be adopted for etching the sacrificial layer. The substrate 10 is an etching stop layer in an etching process of the sacrificial layer 60. An inner diameter of the columnar hollow cavity 61 may be set as needed, which is not limited in the embodiment.

In S23, the inner sidewall surface of the hollow cavity is treated to form the uneven structure on the inner sidewall surface of the hollow cavity. S23 may specifically include the following operations.

In S231, a photoresist layer is formed, the photoresist layer fully filling the hollow cavity.

It is to be noted that the photoresist layer 70 may be formed by deposition or spin-coating. The photoresist layer 70 is made from a photosensitive material. The photosensitive material may include, but not limited to, polymethyl methacrylate, polymethyl glutarimide, and a phenolic resin. The photosensitive material may fill the hollow cavity, thereby forming a solid structure fully filling the hollow cavity 61, and thus the photoresist layer 70 is formed.

In S232, the photoresist layer is exposed to light to form an uneven structure on the photoresist layer.

Referring to FIG. 5, it is to be noted that exposing the photoresist layer 70 to light may be implemented by one-step exposure and one-step development here. For example, the photoresist layer 70 with the uneven structure may be obtained by performing one-step exposure using Ultraviolet (UV) light, Deep Ultraviolet (DUV) light, Extreme Ultraviolet (EUV) light, etc., and then performing development. When the UV light irradiates the photoresist layer 70, the uneven structure may be formed on a surface of a sidewall, close to the sacrificial layer 60, of the photoresist layer 70 under the influence of a standing wave effect. The light may be reflected at an interface between the photoresist layer 70 and the sacrificial layer 60, and the reflected light and the incident light may form an interference to make a light intensity distributed non-uniformly in a depth direction of the photoresist layer 70, thereby forming the uneven structure. In view that a physiochemical characteristic of the photoresist layer 70 after exposure processing changes, part of photoresist layer 70 whose characteristic changes may be removed by etching, thereby forming the uneven photoresist layer 70.

In S233, the inner sidewall surface of the hollow cavity is etched to form the same uneven structure on the inner sidewall surface of the hollow cavity as the photoresist layer.

Referring to FIG. 6, it is to be noted that the inner sidewall surface of the hollow cavity 61 may be etched by dry etching along the uneven structure of the photoresist layer 70, thereby forming the same uneven structure on the inner sidewall surface of the hollow cavity 61. That is, the uneven structure is transferred from the photoresist layer 70 to the sacrificial layer 60.

In S3, a first electrode layer is formed, the first electrode layer being on the inner sidewall surface of the hollow cavity, a surface of the first electrode layer having an uneven structure, and the first electrode layer being electrically connected to the active area.

Referring to FIG. 7, it is to be noted that the first electrode layer 20 may be formed on the inner sidewall surface of the hollow cavity 61 by deposition. Based on the uneven structure on the inner sidewall surface of the hollow cavity 61, when the first electrode layer 20 is deposited, a material for the first electrode layer 20 may be distributed along the uneven structure, thereby forming the same structure on the first electrode layer 20 as the uneven structure.

A thickness of the first electrode layer 20 may be 5 to 30 nm. For example, the thickness of the first electrode layer 20 may be 10 nm, 15 nm, and 25 nm. In practical applications, the user may adjust a specific thickness value of the first electrode layer 20 in the above-mentioned range according to the overall structure of the semiconductor structure 100.

In S4, the sacrificial layer is removed.

Referring to FIG. 8, it is to be noted that it is necessary to continue to form a dielectric layer 30 and a second electrode layer 40 after the first electrode layer 20 is deposited, the sacrificial layer 60 is therefore required to be removed to avoid the influence of the sacrificial layer 60 on the subsequent layer structures. The sacrificial layer 60 may be removed by liquid etching.

In S5, a dielectric layer is formed, the dielectric layer being on a surface of the first electrode layer.

Reference may be made to FIG. 9 for details.

In S6, a second electrode layer is formed, the second electrode layer being on a surface of the dielectric layer.

Referring to FIG. 10, it is to be noted that, based on the uneven structure on the first electrode layer 20, the dielectric layer 30 formed on the first electrode layer 20 and second electrode layer 40 may thus be distributed along the uneven structure, thereby forming corresponding uneven structures. Thicknesses of both the dielectric layer 30 and the second electrode layer 40 may be 5 to 30 nm. In practical applications, the user may adjust specific thickness values of the dielectric layer 30 and the second electrode layer 40 in the above-mentioned range according to the overall structure of the semiconductor structure 100.

According to the preparation method of the semiconductor structure in the embodiment of the disclosure, the substrate 10 is provided, and the active area 11 is formed in the substrate 10, to facilitate provision of a structure foundation for the subsequent semiconductor structure 100. The sacrificial layer 60 with the hollow cavity 61 is formed on the substrate 10, the first electrode layer 20 is arranged on the inner sidewall surface of the hollow cavity 61, and the same uneven structure is formed on the surface of the first electrode layer 20 using the uneven structure on the inner sidewall surface of the hollow cavity 61. Moreover, the first electrode layer 20 is electrically connected to the active area 11, to facilitate electrical signal transmission between a source or a drain in the active area 11 and the first electrode layer 20. The dielectric layer 30 is arranged on the surface of the first electrode layer 20, and the second electrode layer 40 is formed on the surface of the dielectric layer 30, so that a capacitor structure of the semiconductor structure 100 is formed using the first electrode layer 20, the dielectric layer 30, and the second electrode layer 40. The uneven structures on the surface of the first electrode layer 20 and the surface of the dielectric layer 30 help to increase a surface area of an electrode in the capacitor structure, thereby improving capacitance of the semiconductor structure 100.

Furthermore, based on the above description, referring to FIG. 18, an embodiment of the disclosure also provides a semiconductor device 200, which includes a substrate 10, transistors, bit lines, word lines 201, and above-mentioned semiconductor structures 100.

A gate of the transistor is connected with the word line 201. A source and a drain of the transistor are formed in an active area 11 of the substrate 10. The drain of the transistor is connected with the bit line. The source of the transistor is connected with a first electrode layer 20 of the semiconductor structure 100 through an electrical contact portion 202.

It is to be noted that there is a multilayer structure between the substrate 10 and the semiconductor structure 100. FIG. 2 to FIG. 12 only show a relative position relationship between the semiconductor structure 100 and the substrate 10. The semiconductor structure 100 does not directly contact with the substrate 10. Specifically, the buried word lines 201 are formed in the substrate 10, and the bit line and the word line 201 may be crossed, namely may extend in mutually staggered directions. Herein, a gate oxide layer 206 is formed outside the word line 201. An insulating layer 207 is arranged on the side, away from the substrate 10, of the word line 201. The word line 201 is electrically connected with the gate of the transistor. A shallow trench isolation portion 203 is formed between adjacent word lines 201 to separate the word lines 201 from each other. A doped layer is formed between adjacent shallow trench isolation portions 203. The doped layer is doped with different particles to form a source region 204 or drain region 205 in the active area 11.

The source region 204 is electrically connected with the first electrode layer 20 through the electrical contact portion 202. The drain region 205 is electrically connected with the bit line. The electrical contact portion 202 may be a part of the substrate 10. The semiconductor structures 100 are formed above the word lines 201. The semiconductor structures 100 are arranged in an array. An interlayer dielectric layer 208 is formed between adjacent semiconductor structures 100 to isolate the adjacent semiconductor structures 100. Each semiconductor structure 100 is arranged corresponding to one transistor structure. The first electrode layer 20 in the semiconductor structure 100 may be electrically connected to the source region of the active area 11 through the electrical contact portion 202.

The semiconductor device 200 may include multiple memory cells. Each memory cell includes a transistor and a semiconductor structure 100. The semiconductor structure 100 may be configured to store data. The transistor may control data access of the semiconductor structure 100. A voltage signal on the word line 201 may control the transistor to be turned on or turned off, to further read data information stored in the semiconductor structure 100 through the bit line or write data information to the semiconductor structure 100 through the bit line to implement data access of the semiconductor structure 100. Therefore, when the semiconductor structure 100 of the embodiment is applied to the semiconductor device 200, the access performance of the semiconductor device 200 may be improved.

It is to be understood that, in the above descriptions, terms "mount", "connected", and "connection" should be understood broadly, unless otherwise specified and limited. For example, they may refer to fixed connection, or may refer to indirect connection through an intermediate, and may refer to communication inside two elements or an interactive relationship of the two elements. Those of ordinary skill in the art may understand the specific meanings of the terms in the disclosure according to specific conditions. Orientation or position relationships indicated by terms "upper", "lower", "front", "back", "vertical", "horizontal", "top", "bottom", "inner", "outer", etc., are orientation or position relationships shown in the drawings, are adopted not to indicate or imply that indicated devices or components must be in specific orientations or structured and operated in specific orientations but only to conveniently describe the disclosure and simplify descriptions, and thus should not be understood as limits to the disclosure. In the descriptions of the disclosure, "multiple" means two or more than two, unless otherwise stipulated definitely and specifically.

Terms "first", "second", "third", "fourth", etc., (if any), in the specification, claims, and drawings of the disclosure are adopted not to describe a specific sequence or order but to distinguish similar objects. It is to be understood that data used like this may be interchanged as appropriate such that the embodiments of the disclosure described here may be implemented, for example, according to sequences in addition to those illustrated or described here. In addition, terms "include" and "have" and any transformations thereof are intended to cover nonexclusive inclusions. For example, a process, method, system, product, or device including a series of steps or units is not limited to the steps or units that are clearly listed, but also may include other steps or units that are not clearly listed or intrinsic to the process, the method, the product, or the device.

It is finally to be noted that: the above embodiments are adopted not to limit but only to describe the technical solutions of the disclosure. Although the disclosure is described with reference to embodiments in detail, those of ordinary skill in the art should know that modifications may also be made to the technical solutions recited in embodiments, or equivalent replacements may be made to part or all of technical features therein. These modifications or replacements do not make the essence of the corresponding technical solutions depart from the scope of the technical solutions of embodiments of the disclosure.

The invention claimed is:

1. A semiconductor structure, comprising:
    a substrate, comprising an active area;
    a first electrode layer, arranged on the substrate and electrically connected to the active area, the first electrode layer extending in a direction perpendicular to the substrate;
    a dielectric layer, arranged on a surface of the first electrode layer; and
    a second electrode layer, arranged on a surface of the dielectric layer,
    wherein each of the surface of the first electrode layer and the surface of the dielectric layer is provided an uneven structure,
    wherein a projection of the first electrode layer on the substrate is a first ring, and a projection of the dielectric layer on the substrate comprises a second ring and a third ring, the second ring being nested inside the first ring, and the third ring being sleeved outside the first ring; and
    wherein a projection of the second electrode layer on the substrate comprises a solid portion and a fourth ring, the solid portion being located inside the second ring, and the fourth ring being sleeved outside the third ring.

2. The semiconductor structure of claim 1, wherein a plurality of first protruding portions and a plurality of first recessed portions are arranged on the surface, on a side close to the dielectric layer, of the first electrode layer, the first protruding portions and the first recessed portions being located on two opposite sides of a reference plane respectively, and the first protruding portions and the first recessed portions being mutually staggered and sequentially connected end to end; and
    wherein the first electrode layer is cylindrical, the first electrode layer has a median axis, the reference plane is perpendicular to the substrate, and a distance between the reference plane and the median axis is an average value of a distance between the first protruding portions and the median axis and a distance between the first recessed portions and the median axis.

3. The semiconductor structure of claim 2, wherein the dielectric layer is a concave-convex structure, the dielectric layer comprises a plurality of first bending portions and a plurality of second bending portions, the first bending portions and the second bending portions being located on two opposite sides of a first neutral plane respectively and bent in opposite directions, and the first bending portions and the second bending portions being mutually staggered and sequentially connected end to end; and
    wherein the first neutral plane is perpendicular to the substrate, and a distance between the first neutral plane and the reference plane is an average value of a distance between the first bending portions and the reference plane and a distance between the second bending portions and the reference plane.

4. The semiconductor structure of claim 3, wherein a plurality of second protruding portions and a plurality of second recessed portions are arranged on a surface, on a side close to the dielectric layer, of the second electrode layer, the second protruding portions and the second recessed portions being located on two opposite sides of a second neutral plane respectively, and the second protruding portions and the second recessed portions being mutually staggered and sequentially connected end to end; and
    wherein the second neutral plane is perpendicular to the substrate, and a distance between the second neutral plane and the reference plane is an average value of a distance between the second protruding portions and the reference plane and a distance between the second recessed portions and the reference plane.

5. The semiconductor structure of claim 4, wherein the first bending portions, the second bending portions, the first protruding portions, the first recessed portions, the second protruding portions, and the second recessed portions are all arc-shaped or hemispheric.

6. The semiconductor structure of claim 1, wherein an electrical contact portion is arranged between the first electrode layer and the active area, and the first electrode layer is electrically connected with the active area through the electrical contact portion.

7. The semiconductor structure of claim 1, wherein a common electrode layer is arranged on a side, away from the substrate, of the second electrode layer, and the second electrode layer is electrically connected to the common electrode layer.

8. The semiconductor structure of claim 1, wherein a material for the first electrode layer comprises a combination of one or more of tungsten, titanium, nickel, cobalt, titanium nitride, or tungsten nitride.

9. The semiconductor structure of claim 1, wherein a material for the second electrode layer comprises a combination of one or more of silicon, germanium, a silicon-germanium compound, tungsten, titanium, nickel, cobalt, titanium nitride, or tungsten nitride.

10. The semiconductor structure of claim 1, wherein a material for the dielectric layer comprises a combination of one or more of hafnium oxide, zirconia, or zirconium aluminum oxide.

11. A semiconductor device, comprising a substrate, transistors, word lines, bit lines, and semiconductor structures, each of the semiconductor structures comprising:
    the substrate, comprising an active area;
    a first electrode layer, arranged on the substrate and electrically connected to the active area, the first electrode layer extending in a direction perpendicular to the substrate;
    a dielectric layer, arranged on a surface of the first electrode layer; and
    a second electrode layer, arranged on a surface of the dielectric layer,
    wherein each of the surface of the first electrode layer and the surface of the dielectric layer is provided an uneven structure, wherein the bit lines are arranged on the substrate, the word lines are arranged on the bit lines in a staggered manner, a gate of each of the transistors is connected with one of the word lines, a source and a drain of each of the transistors are formed in the active area of the substrate, the drain of each of the transistors is connected with one of the bit lines, and the source of each of the transistors is connected with the first electrode layer of one of the semiconductor structures.

12. The semiconductor device of claim 11, wherein a plurality of first protruding portions and a plurality of first recessed portions are arranged on the surface, on a side close to the dielectric layer, of the first electrode layer, the first protruding portions and the first recessed portions being located on two opposite sides of a reference plane respectively, and the first protruding portions and the first recessed portions being mutually staggered and sequentially connected end to end; and
wherein the first electrode layer is cylindrical, the first electrode layer has a median axis, the reference plane is perpendicular to the substrate, and a distance between the reference plane and the median axis is an average value of a distance between the first protruding portions and the median axis and a distance between the first recessed portions and the median axis.

13. The semiconductor device of claim 12, wherein the dielectric layer is a concave-convex structure, the dielectric layer comprises a plurality of first bending portions and a plurality of second bending portions, the first bending portions and the second bending portions being located on two opposite sides of a first neutral plane respectively and bent in opposite directions, and the first bending portions and the second bending portions being mutually staggered and sequentially connected end to end; and
wherein the first neutral plane is perpendicular to the substrate, and a distance between the first neutral plane and the reference plane is an average value of a distance between the first bending portions and the reference plane and a distance between the second bending portions and the reference plane.

14. The semiconductor device of claim 13, wherein a plurality of second protruding portions and a plurality of second recessed portions are arranged on a surface, on a side close to the dielectric layer, of the second electrode layer, the second protruding portions and the second recessed portions being located on two opposite sides of a second neutral plane respectively, and the second protruding portions and the second recessed portions being mutually staggered and sequentially connected end to end; and
wherein the second neutral plane is perpendicular to the substrate, and a distance between the second neutral plane and the reference plane is an average value of a distance between the second protruding portions and the reference plane and a distance between the second recessed portions and the reference plane.

15. The semiconductor device of claim 14, wherein the first bending portions, the second bending portions, the first protruding portions, the first recessed portions, the second protruding portions, and the second recessed portions are all arc-shaped or hemispheric.

16. The semiconductor device of claim 11, wherein a projection of the first electrode layer on the substrate is a first ring, and a projection of the dielectric layer on the substrate comprises a second ring and a third ring, the second ring being nested inside the first ring, and the third ring being sleeved outside the first ring; and
wherein a projection of the second electrode layer on the substrate comprises a solid portion and a fourth ring, the solid portion being located inside the second ring, and the fourth ring being sleeved outside the third ring.

17. A preparation method of a semiconductor structure, comprising:
providing a substrate having an active area;
forming a sacrificial layer having a hollow cavity and located on the substrate, an inner sidewall surface of the hollow cavity having an uneven structure;
forming a first electrode layer located on the inner sidewall surface of the hollow cavity, a surface of the first electrode layer having an uneven structure, the first electrode layer being electrically connected to the active area, and the first electrode layer extending in a direction perpendicular to the substrate;
removing the sacrificial layer;
forming a dielectric layer located on the surface of the first electrode layer, a surface of the dielectric layer having an uneven structure; and
forming a second electrode layer located on the surface of the dielectric layer,
wherein a projection of the first electrode layer on the substrate is a first ring, and a projection of the dielectric layer on the substrate comprises a second ring and a third ring, the second ring being nested inside the first ring, and the third ring being sleeved outside the first ring; and
wherein a projection of the second electrode layer on the substrate comprises a solid portion and a fourth ring, the solid portion being located inside the second ring, and the fourth ring being sleeved outside the third ring.

18. The preparation method of the semiconductor structure of claim 17, wherein the step of forming the sacrificial layer having the hollow cavity and located on the substrate, the inner sidewall surface of the hollow cavity having the uneven structure, specifically comprises:
forming the sacrificial layer located on the substrate, a material for the sacrificial layer being different from a material for the substrate;
etching the sacrificial layer to form the hollow cavity in the sacrificial layer, wherein the hollow cavity is columnar; and
treating the inner sidewall surface of the hollow cavity to form the uneven structure on the inner sidewall surface of the hollow cavity.

19. The preparation method of the semiconductor structure of claim 18, wherein the step of treating the inner sidewall surface of the hollow cavity to form the uneven structure on the inner sidewall surface of the hollow cavity specifically comprises:
forming a photoresist layer located on the inner sidewall surface of the hollow cavity;
exposing the photoresist layer to light to form an uneven structure on the photoresist layer; and
etching the inner sidewall surface of the hollow cavity to form the uneven structure on the inner sidewall surface of the hollow cavity, wherein the uneven structure on the inner sidewall surface of the hollow cavity is the same as the uneven structure on the photoresist layer.

* * * * *